(12) United States Patent
Yamaguchi et al.

(10) Patent No.: US 6,521,909 B2
(45) Date of Patent: Feb. 18, 2003

(54) THIN FILM SEMICONDUCTOR DEVICE CONTAINING POLYCRYSTALLINE SI-GE ALLOY AND METHOD FOR PRODUCING THEREOF

(75) Inventors: Shinya Yamaguchi, Mitaka (JP); Takeo Shiba, Kodaira (JP); Mutsuko Hatano, Kokubunji (JP); Seong-Kee Park, Hachioji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/790,545

(22) Filed: Feb. 23, 2001

(65) Prior Publication Data

US 2002/0102823 A1 Aug. 1, 2002

(30) Foreign Application Priority Data

Feb. 1, 2001 (JP) ........................................ 2001-025531

(51) Int. Cl.[7] ..................... H01L 29/06; H01L 31/0328; H01L 31/0336; H01L 31/072; H01L 31/109
(52) U.S. Cl. ....................................................... 257/19
(58) Field of Search .......................... 257/19, 347–354; 438/141, 142, 149, 150, 164, 166, 168, 172, 311, 312, 796, 798, 933

(56) References Cited

U.S. PATENT DOCUMENTS 6,228,692 B1 * 5/2001 Tsutsu .......................... 438/164
6,303,963 B1 * 10/2001 Ohtani et al. ................. 257/350

FOREIGN PATENT DOCUMENTS

| JP | 7-321339 | 12/1995 |
| JP | 8-55808 | 2/1996 |
| JP | 10-41234 | 2/1998 |

OTHER PUBLICATIONS

Ukhin et al., "Change in electrical property of single crystals of Ge–Si (Ge1–xSix) solid solutions due to irradiation", Fiz. Tekh. Poluprovodon. (Leningrad), vol. 18 (6), p 981–5(1984).*
Qian et al. "Growth of Ge–Si/Si heteroepitaxial films by remote plasma vapor deposition", J. Vac. Sci. Technol. A, vol. 10 (4, Pt. 2), p 1920–6 (1992).*
Owusu–Sekyere et al., "Characterization of Si–Ge and Si–Ge–Ga phosphide thermoelements", Mater. Sci. Eng. B, vol. B3 (3), p 231–40 (1989).*
Kim et al., "Effects of germanium on grain size and surface roughness of the solid phase crystallized polycrystalline Si1–xGex films", Mater. Res. Soc. Symp. Proc. (1997).*
Edelman et al., "Crystallization of amorphous Si–Ge films on silica", Thin Solid Films, vol. 222 (1–2), p 57–9 (1992).*
"Physics of Semiconductor Devices"p. 29, $2^{nd}$ Edition.
M.S. Prokes and F. Spaepen, App. Lett., vol. 47, p. 234(1985).
K.Nakagawa, N. Sugii, S. Yamaguchi, and M. Miyao, J. Cryst. Growth, vol. 210, p. 560(1999).
M.V. Fischetti and S.E. Laux, J. Appl. Phys. vol. 80, p. 2234,(1996).

* cited by examiner

Primary Examiner—Michael Sherry
Assistant Examiner—Asok Kumar Sarkar
(74) Attorney, Agent, or Firm—Antonelli, Terry, Stout & Kraus, LLP

(57) ABSTRACT

A high performance thin film transistor is provided containing polycrystalline Si-Ge alloy. The TFT has a crystal structure restraining both current scattering in a grain boundary and surface roughness by introduction of Ge into Si. This permits realizing an image display device having high performance and a large area at low cost.

6 Claims, 12 Drawing Sheets plan-view SEM image

100 μm

FIG. 7A
FIG. 7B
plan-view SEM image
plan-view dark-field TEM image
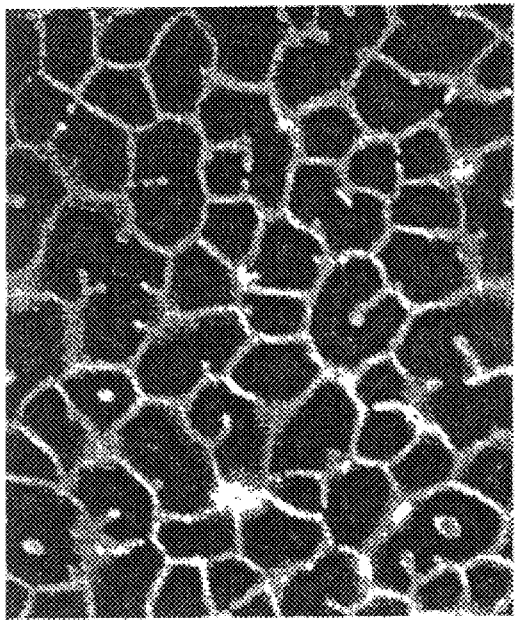

illustration of grain structure

FIG. 9A
(PRIOR ART)
FIG. 9B
(PRIOR ART)
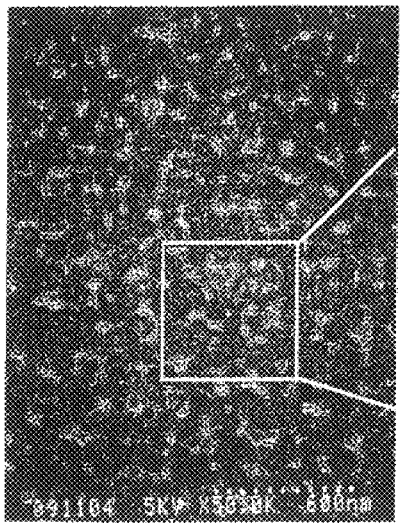
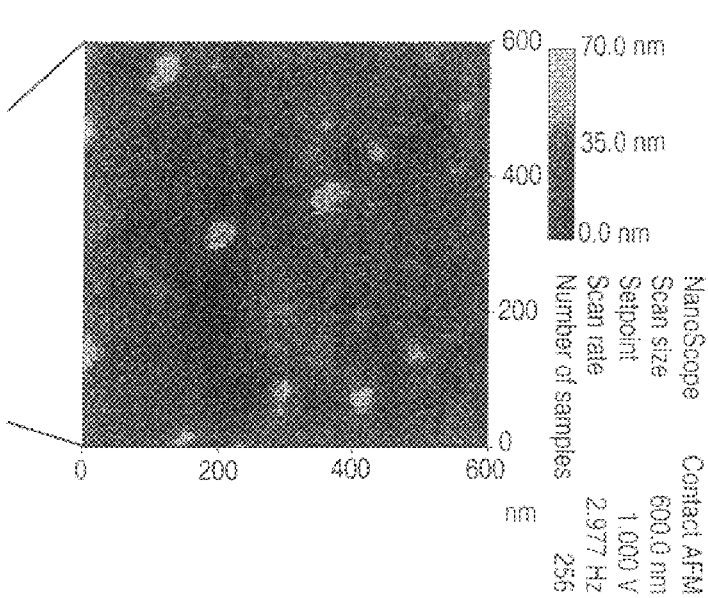

FIG. 10A
FIG. 10B
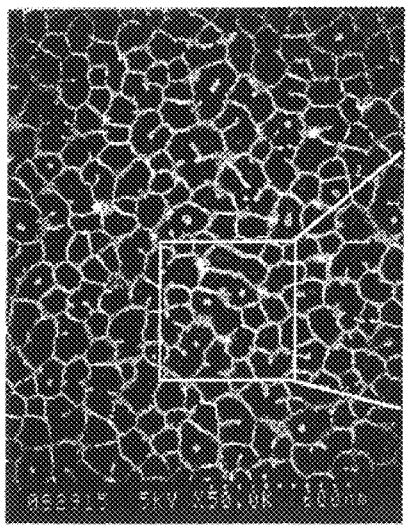
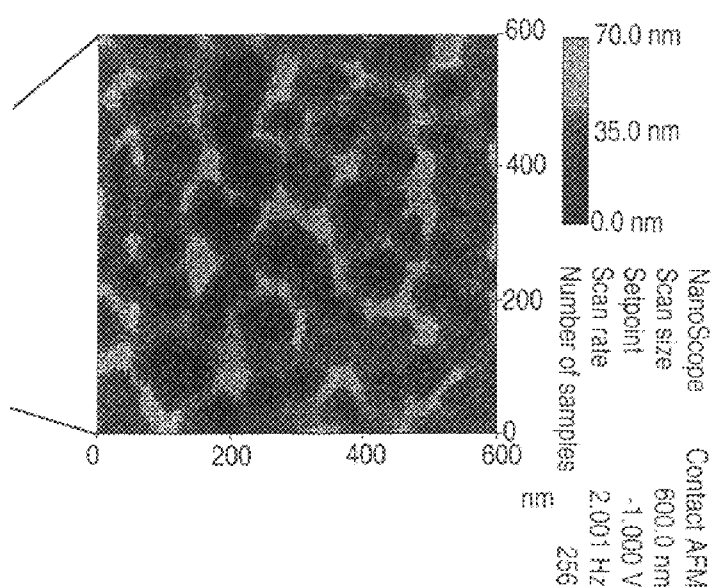

THIN FILM SEMICONDUCTOR DEVICE CONTAINING POLYCRYSTALLINE SI-GE ALLOY AND METHOD FOR PRODUCING THEREOF

BACKGROUND OF THE INVENTION

Field of the Invention

The present invention relates to thin film transistor devices and methods for producing thereof, and more particularly to a thin film transistor device and a method for producing thereof suitable for a transistor used a polycrystalline silicon (poly-Si).

The thin film transistor devices are utilized mainly for an image display device of a liquid crystal display device (LCD), a plasma display device (PDP) and the like as pixels or thin film transistors (TFT) for driving a peripheral circuit.

Mainly, high-temperature poly-crystalline Si has been used for a base thin film employed for forming a conventional thin film transistor. This means that a poly-crystalline Si (poly Si) thin film is formed on a quartz substrate being an insulator substrate by a high-temperature heat treatment at temperature of below or above 900° C., and that the poly-crystalline Si of comparatively large grain size (for example, 500–600 nm) is formed.

A TFT formed on the high-temperature poly-crystalline Si (hereinafter, referred to as high-temperature poly-Si) thin film utilizes a Si thin film having a low density in a grain boundary of crystal and excellent crystallinity, as a channel, so that field effect mobility of 100–150 [$cm^2/Vs$], as a value close to that conventional type Si-LSi on a Si substrate having (~500 [$cm^2/Vs$], refer to a document, S. M. Sze, Physics of Semiconductor Devices, p. 29, Second Edition, Wiley), can be obtained.

However, the high—temperature poly-Si is necessitated to use the expensive quartz substrate as the insulator substrate capable of withstanding through a high temperature process, since this cost of the substrate has been the main cause of difficulty in a cost reduction of an entire semiconductor device, generalization of use of a TFT has been restricted.

In recent years, in place of the high-temperature poly-Si, a research on low-temperature poly-crystalline Si (hereinafter, referred to as low-temperature poly-Si) has vigorously been carried out. This is the poly-crystalline Si crystallized amorphous Si formed on a low cost glass substrate or a plastic substrate by a plasma CVD method or the like utilizing a zone melting re-crystallization method such as excimer laser annealing. With the use of this method, since the poly-crystalline Si thin film is capable of being formed at low-temperature (~150° C.), there is an advantage that a remarkably inexpensive TFT can be formed.

However, the low-temperature poly-Si up to now is small (~100 nm) in crystal grain size compared with that of the high-temperature poly-Si and the poly-crystalline Si only with large (~50 nm) surface roughness has been formed.

When crystal grain size is small, there are such drawbacks that a density in the grain boundary of crystal existing in a current path becomes large, and current mobility is lowered through current scattering in the grain boundary thereof.

Further, when the surface roughness is large, a requirement for thickening (~100 nm) a gate insulation film to that amount is generated in order to restrain a gate leak current, consequently, since the carrier number induced to the channel by the same gate voltage becomes small, the current mobility is also lowered.

From that reason, in a TFT of a product base utilizing conventional low-temperature poly-Si as an elemental material, the field effect mobility thereof is restrained to a degree of up to 150 [$cm^2/Vs$] in case of an electron carrier, is restrained to a degree of up to 50 [$cm^2/Vs$] in case of positive hole carrier. With a small mobility like this, since elemental performance cannot reach the required elemental performance, there is such a drawback as that sorts of the elements capable of being formed on the same glass (or plastic) substrate are restricted.

For example, in the case of the image display device, a pixel circuit part which is comparatively low in required performance, can be formed on glass (or plastic), whereas the other circuits which are high in the required performances such as a source driver, a gate driver, a shift register, and a peripheral controller, since they cannot be formed on the same substrate, they are integrated on a printed circuit board as semi-conductor chips utilized a conventional Si-LSI art, this printed circuit board is connected with the glass substrate and must be used.

With such a method, there has been drawbacks as that in addition to small dimensioning (4 in.–10 in.) in screen size depending upon a dimension where the periphery circuit part is mounted, a remarkable increase in cost of the entire image display device are brought about. Further, in a power saving image display device, which is promising for a future market, a TFT is indispensable to conduct CMOS (complementary MOS) forming, for that purpose, the requirement for a further increase in performance with respect to the field effect mobility of a positive hole carrier is estimated.

In order to improve these drawbacks, the art to achieve enhancement in performance of a TFT into high level is necessitated by realizing such a poly-crystalline thin film as that current scattering in the grain boundary being restrained, and the surface roughness thereof being lessened. In order to high-function the low-temperature poly-Si, various arts have been proposed as exemplified hereinafter.

Among them, for example, an art (for example, Japanese Unexamined Patent Publication H7-321339) for forming poly-crystalline Si having an [111] axis in a current moving direction, by introducing a metal element for selectively promoting an amorphous Si film formed on the insulator substrate into crystallization and by carrying out respective crystal growth in a direction parallel to a substrate; an art (for example, Japanese Unexamined Patent Publication H10-41234) for forming rectangular poly-crystalline Si having a <100> axis in a direction perpendicular to the substrate, and a {220} surface in parallel (or at an angle of 45°) to a beam scanning direction by accurately controlling a shape of a laser beam for annealing and a scanning rate of a laser annealing position; and an art (for example, Japanese Unexamined Patent Publication H8-55808) for forming columnar poly-crystalline Si layers by forming a first poly-crystalline Si layer on the substrate, by forming a seed crystal having either of typical orientations ({100}, {110}, and {111}) by an-isotropic etching and by forming a second poly-crystalline Si layer thereon and the like.

However, in spite of these numerous trials, a TFT with sufficiently high mobility so far has not been realized.

SUMMARY OF THE INVENTION

All of conventional crystallization methods of a low-temperature poly-Si thin film cannot be said as sufficiently completed arts, for example, when either of the maximum grain size, or surface roughness is taken up, performance of a TFT has not been, as yet, met demand required for a peripheral circuit integrated type liquid crystal display panel. So that these arts cannot sufficiently replace an existing thin film transistor device of low function. Accordingly, a technical theme to realize an image display device having the high performance and a large area with low cost is extremely important.

Thus, a first object of the present invention is, in low-temperature poly-Si being a elemental material of a TFT, to provide a thin film transistor device excellent in characteristics in which a conventional art cannot provide by restraining current scattering in the grain boundary of crystal, by decreasing the surface roughness, and by realizing a poly-crystalline thin film having a crystal structure so as to realize high mobility even for a positive carrier, a second object is to provide a production method by which a thin film transistor device can be easily obtained, a third object is to provide an image display device utilized the thin film transistor device.

In order to achieve the objects described above and as a result of various experiments and investigations about low-temperature poly-Si for forming a TFT, the inventors have obtained an important knowledge being capable of realizing the TFT with high mobility, by introducing Ge into a poly-Si thin film, by differentiating (for further details, a ratio of Ge composition in a grain boundary of crystal is made larger than a portion where a ratio of Ge composition in an interior grain is the minimum) a ratio of Ge composition between a crystal interior grain and the grain boundary by a phase separation involved in crystallization, by restraining a current scattering factor in a grain boundary, and by restraining surface roughness utilizing a difference of volumes of a crystal.

The present invention has been carried out based on these knowledge and the first object described above can be achieved by a thin film transistor device including an insulator substrate, a poly-crystalline thin film formed on the insulator substrate, and a transistor composed of a source, a drain, a channel, and a gate, formed on the poly-crystalline thin film, wherein the poly-crystalline thin film in a channel part of the transistor is composed of a silicon germanium poly-crystal $Si_{1-x}Ge_x$, however, a ratio x of a Ge composition relative to Si is 0<x<1, and a ratio x of a Ge composition in the poly-crystalline thin film is larger in a grain boundary than a portion where a Ge composition in an interior grain of crystal becomes the minimum.

Further, preferably, a thickness of the poly-crystalline thin film is 10–100 nm, a ratio x of a Ge composition in a central part of a crystal grain constituting the poly-crystalline thin film is 0<x≦0.3, a ratio x of a Ge composition in a grain boundary is 0.1<x≦1.0, the ratio x of the Ge composition described above is invariably larger in a grain boundary than a portion where a Ge composition in an interior grain becomes the minimum.

Further preferable points of characteristics of a thin film transistor device will be enumerated hereinafter.

In the thin film transistor device described above, a poly-crystalline $Si_{1-x}Ge_x$ thin film is characterized in that surface roughness in a grain boundary is equal to or less than 30 nm.

In the thin film transistor device described above, a main current carried in a channel part of the transistor is characterized by being a positive hole.

The thin film transistor device described above has an insulator substrate, a poly-crystalline thin film formed on the insulator substrate, and a transistor composed of a source, a drain, a channel, and a gate, and the poly-crystalline thin film in a channel part of the transistor described above is characterized by having a {110}-oriented crystal grain in parallel with the substrate and is characterized in that an average lattice constant in a grain boundary is larger than an average lattice constant in an interior grain part of crystal.

The thin film transistor device described above is characterized by retaining the insulator substrate, a poly-crystalline $Si_{1-x}Ge_x$ thin film formed on the insulator substrate, however, a ratio x of a Ge composition relative to Si is 0<x<1, and a circuit part constituted by integrating a plurality of transistors composed of sources, drains, channels, and gates formed on the poly-crystalline $Si_{1-x}Ge_x$ thin film and is characterized in that the circuit part described above includes a CMOS type transistor making present as a mixture of both of a p type transistor and an n type transistor.

Further, the thin film transistor device described above is characterized in that a ratio x of a Ge composition of the p type transistor constituting the circuit part is larger than a ratio of a Ge composition of the n type transistor.

The second object described above is achieved by a method for producing a thin film transistor device characterized by having a step for forming an amorphous $Si_{1-x}Ge_x$ layer of a film thickness of 10–100 nm, however, a ratio x of a Ge composition relative to Si is 0<x<1 and an annealing step for crystallizing the amorphous $Si_{1-x}Ge_x$ layer described above by means of an excimer laser having an energy density of 200–300 mJ/cm$^2$, and the pulse numbers are 1–50 shots.

Further, preferably, in the method for producing a thin film transistor device, the annealing step described above is characterized by varying an energy density as (180+T)~(200+T) mJ/cm$^2$ corresponding to a film thickness when the film thickness of the amorphous $Si_{1-x}Ge_x$ layer described above is set T nm.

The third object described above is achieved by an image display device, wherein the image display device has an image display part, an image display circuit controlling a display of the image display part and including at least a data driver, a gate driver, and a buffer amplifier, and a peripheral circuit part positioned in the neighborhood of the image display circuit and controlling the image display circuit described above, and is characterized in that the image display circuit and the peripheral circuit part described above are integrated on the same substrate as the substrate constituting the image display device described above, the image display circuit and the peripheral circuit part described above further retains an insulator substrate, a poly-crystalline $Si_{1-x}Ge_x$ thin film formed on the insulator substrate, however, a ratio x of a Ge composition relative to Si is 0<x<1, and a circuit part constituted by integrating a plurality of transistors composed of sources, drains, channels, and gates formed on the poly-crystalline $Si_{1-x}Ge_x$ thin film, and the circuit part described above includes a CMOS type transistor making present as a mixture of either one or both of a p type transistor or/and an n type transistor.

Further, preferably, the image display device described above is characterized in that a ratio x of a Ge composition of a p type transistor is larger than a ratio of a Ge composition of an n type transistor.

Furthermore preferably, it is characterized in that the circuit part described above retains positioning marks provided in the neighborhood of these circuits in order to differentiate whichever sorts of the p type transistor, n type transistor, and the CMOS type transistor.

As explained above, according to the present invention, a high mobility TFT is realized by restraining a current scattering factor in a grain boundary of crystal with an introduction of Ge into Si and a differential of ratios of Ge compositions between an interior grain and a grain boundary of crystal resulted from a phase separation accompanied with crystallization, and by restraining surface roughness with the use of a difference in volumes of a crystal. As a result, large area (for example, equal to or more than 15 inches) image display devices can be highly integrated, since pixel matrices and peripheral circuits are capable of being intensively formed on the same glass substrate.

BRIEF DESCRIPTION OF THE DRAWINGS

FIG. 7 shows a surface SEM image (left figure) and a plane TEM (transmission electron microscope) image of a poly-crystalline SiGe thin film of the present invention.

FIG. 9 shows a prior art being conventionally a surface SEM image (left figure) and an AFM (atomic force microscope) image (right figure) for a squarely enclosed region in the left figure of a poly-crystalline Si thin film.

FIG. 10 shows a SEM image (left figure) and an AFM image (right figure) for a squarely enclosed region in the left figure of a poly-crystalline SiGe thin film of the present invention.

DETAILED DESCRIPTION OF THE PREFERRED EMBODIMENTS

Hereinafter, a characteristic of a crystal growth SiGe which is features of the present invention will be explained in detail in comparison with a prior art in reference to FIG. 6–FIG. 12. In the meantime, in the present specification, a crystallo-graphically equivalent crystal orientation group like crystal orientations (110), (101), and (011) are summarized and are represented as {111}.

Figure 6:
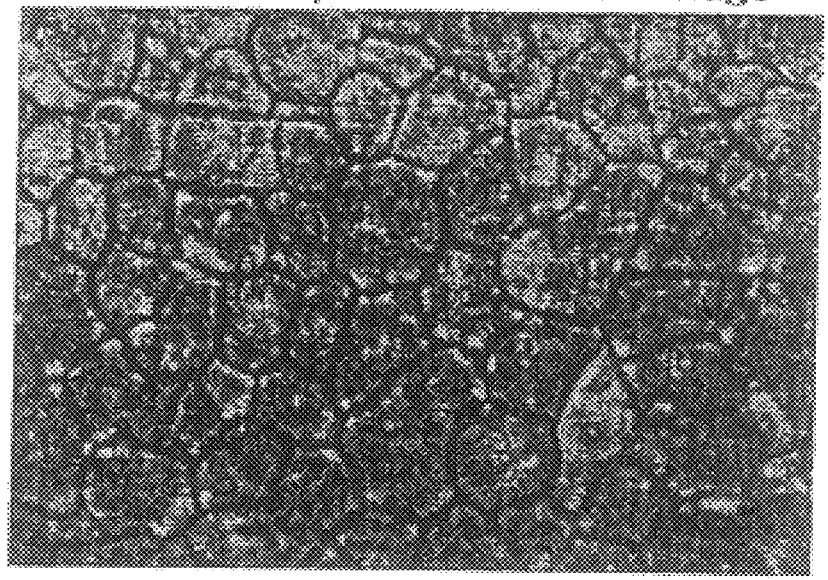
FIG. 6 shows a prior art being a surface SEM (scanning electron microscope) image of a poly-crystalline Si thin film formed by eximer laser annealing being conventionally a base material of TFT.

FIG. 6 shows a prior art being a surface SEM (scanning electron microscope) image of a poly-crystalline Si thin film formed by eximer laser annealing being conventionally a base material of TFT.

In the meantime, in this poly-crystalline Si thin film, a film is formed on a glass substrate with a thickness of 50 nm by well known plasma CVD method, and the film is then annealed by an excimer laser under the condition of an energy density of 340 mJ/cm².

Although an example with relatively small size of 50–100 nm is mentioned as average grain size of low-temperature poly-Si, the maximum grain size can be achieved at present is in an extent of 200–300 nm. However, the greater the grain size the more increase the dispersion of the grain size, as a result, it has been a drawback that large dispersion is generated in TFT mobility.

Therefore, as practical grain size, the size of 50–100 nm is a typical example mentioned in a figure. Though grain boundaries of respective crystal grains show dark contrasts, in an adjacent portion thereto can sporadically be observed a plurality of bright contrast regions. A difference in the contrast like this corresponds to surface roughness.

A heat treatment method such as the excimer laser annealing involves volume expansion of a Si crystal in processes from melting to solidifying. Therefore, in the vicinity of grain boundaries where respective crystal grains bump against each other, force uplift a film in an upper direction perpendicular to a substrate is acted in order to set expanded volume portions to free. This force is further enlarged in the vicinity of a triple point in grain boundaries of crystals and constitutes a cause of surface roughness. An average surface roughness reaches to 50 nm relative to a Si-poly crystal with a film thickness of 50 nm.

FIG. 7 shows a surface SEM image (left figure) and a plane TEM (transmission electron microscope) image of a low-temperature poly-crystalline $Si_{1-x}Ge_x$ thin film of the present invention. The film is formed by 30 shots of pulsed laser beam under conditions that a ratio x of Ge composition is, x=0.3, an energy density of KrF excimer laser is 240 mJ/cm².

In the meantime, in this case also, the film of a thickness of 50 nm is formed on a glass substrate by a well known plasma CVD method, at that time, 30 mol % of Ge is introduced, as a source, relative to Si into CVD gas, and formed a $Si_{0.7}Ge_{0.3}$ thin film (hereinafter simply refer to SiGe thin film). That film is annealed by the excimer laser under the condition of an energy density of 240 mJ/cm².

When a left-side figure in FIG. 7 is observed, it will be understood that although crystal grain size is substantially similar to that of a poly-crystalline Si thin film in FIG. 6, a contrast relationship between an interior grain and a grain boundary is reversed. It is because, in contrast to a case in FIG. 6, a portion of the grain boundary is projected upward more than a portion of the interior grain. As a result of elementary analysis, remarkably higher concentration of Ge is detected in the grain boundary than that of the interior grain, the high concentration region is approximately coincided with the bright contrast region in the FIG. 7.

When a dark field image (right figure in FIG. 7) of plane TEM of poly-crystalline $Si_{0.7}Ge_{0.3}$ thin film is observed, details of a crystal structure can be known. In this figure (right figure in FIG. 7), measurement is conducted under the condition that a {110} surface in parallel with a surface of substrate is brightly displayed. From the figure it will be understood that the most of the crystal grains are similar in brightness to each other, the several number of black grains are existed between the crystal grains. It will be understood that in an interior grain of crystal, rectilinear patterns to be considered as stacking faults or twin crystals are observed at several places, the other portions thereof are constituted of substantially beautiful single crystals.

Figure 8:
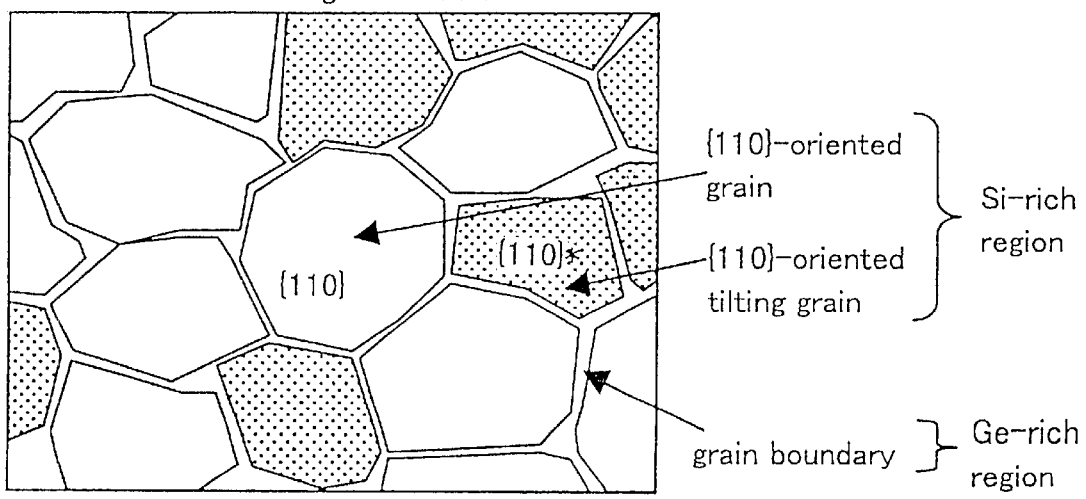
FIG. 8 shows a view typically illustrating a crystal structure of a poly-crystalline SiGe thin film of the present invention.

FIG. 8 shows a view typically illustrating a crystal structure of a poly-crystalline SiGe thin film of the present invention illustrated in FIG. 7. Most of the crystal grains have {110} surfaces in parallel to the substrate and trued up one another, the several number of grains having different crystal orientations are existed between the crystal grains. These grains having different crystal orientations have been found that the {110} surfaces inclined at an angle of 1–10° from a surface in parallel to the substrate. Thereby, it will be understood that the poly-crystalline SiGe thin film of the present invention is the poly-crystal having basically a {110} surface orientation. Respective interior grain is more Si-rich than a ratio of Ge composition which has been introduced before annealing, the grain boundaries are constituted of the crystals having larger ratios of a Ge composition.

The cause for occurrence of a phase separation (a ratio of Ge composition are different between crystal interior grain and grain boundary) like this is resulted from a diffusion coefficient of Ge in Si and bonding energy of Si versus Ge. The diffusion coefficient of Ge in amorphous Si is comparatively large and $D=8.0\times10^{-20}$ [cm$^2$/s] even at temperature of 600° C.(refer to document, S. M. Prokes and F. Spaepen, Appl. Phys. Lett., vol 47, p234 (1985)).

Under a mobility condition like this, in order that a crystal assemble a stable lattice, it is better to minimize bonding energy between respective atoms. The boning energy between Si—Si, Si—Ge, and Ge—Ge are respectively 3.73 eV, 3.65 eV, and 3.56 eV (refer to document, K. Nakagawa, N. Sugii, S. Yamaguchi, and M. Miyao, J. Cryst, Growth, vol. 210, p560 (1999)).

Therefore, Ge is energetically stable bonded together to Ge rather than bonded to Si. When a condition is set that there is more Si than Ge before annealing, Si crystal nucleus is produced in a certain optional position at the initial stage of crystallization, in a growth process thereof, a crystal grain involves many Si performing a growth while expelling Ge to a periphery thereof. It is believed that a poly-crystalline SiGe having a crystal structure described above is formed by attaining a growth everywhere the crystal grains like this.

The phase separation itself between elements composed of such a plurality of sorts thereof is traditionally known. There is an example (for example, Japanese Unexamined Patent Publication H2000-261043) that a poly-crystalline thin film is utilized as a thermo-electric conversion material by cutting and separating phase separated elements respectively to p type/n type. However, the poly-crystalline SiGe thin film in which structures in every portions of the grain boundaries thereof are constituted of their perfectly Ge-rich state such as a poly-crystalline Si thin film of the present invention, the surface roughness in the grain boundary thereof can be restrained as described later, and which can be applied to a TFT has not been known up to now.

Further, when the phase of Ge-rich like this can be produced, in particular, the perfect state thereof constitutes an advantageous structure to positive hole mobility. A single crystal Ge (electron mobility ~3000 cm$^2$/Vs, positive hole mobility ~1500 cm$^2$/Vs) as a property of a material itself has a larger mobility than a single crystal Si (electron mobility ~1500 cm$^2$/Vs and positive hole mobility ~500 cm$^2$/Vs) (refer to a document, M. V. Fischetti and S. E. Laux, J. Appl. Phys. Vol 80, p2234, (1996)).

A problem of interface stability of Ge-oxidation film conventionally questioned has been found that it is not so much problem if not using a thermal oxidation film but a deposit oxidation film. The reason why Ge having such a high potential has not been utilized to a TFT is that Ge cannot be practically applied, since grain size of poly-crystalline Ge capable of being formed is remarkably small and current scattering in a grain boundary is large. However, if the material has a poly-crystalline SiGe thin film structure like present invention, there is such an advantage that, as a whole, high mobility can be realized by making grain size thereof equivalent to that of poly-crystalline thin film, and by existing Ge-rich phases of high mobility in the vicinity of grain boundary having large current scattering.

FIG. 9 shows a prior art being conventionally a surface SEM image (left figure) and an AFM (atomic force microscope) image (right figure) for a squarely enclosed region in the left figure of a poly-crystalline Si thin film. The AFM image is displayed the surface roughness directly with a ratio of contrast as it is. Bright projection parts are observed everywhere in the vicinity of the triple points of crystal grains in a poly-crystalline Si thin film. A difference of elevation between a top-most point of these projection parts and bottom-most point of recess parts is about 50 nm as described above and is remarkably large. This means that force facing upward operated by volume expansion is remarkably large at the triple point.

On the other hand, FIG. 10 shows a SEM image (left figure) and an AFM image (right figure) for a squarely enclosed region in the left figure of a poly-crystalline SiGe thin film of the present invention. As clearly understood from the AFM image, portions corresponding to grain boundaries are all over bright, and the projection parts are formed in that portions.

Figure 11A:
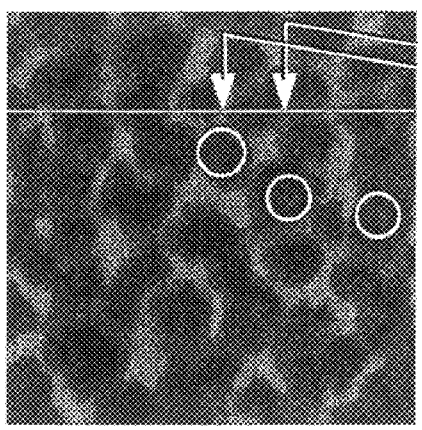
FIG. 11 shows an AFM image (left figure) in FIG. 10 shown above and a view illustrating a distribution of elevations sectioned at a straight line portion drawn in the left figure.
Figure 11B:
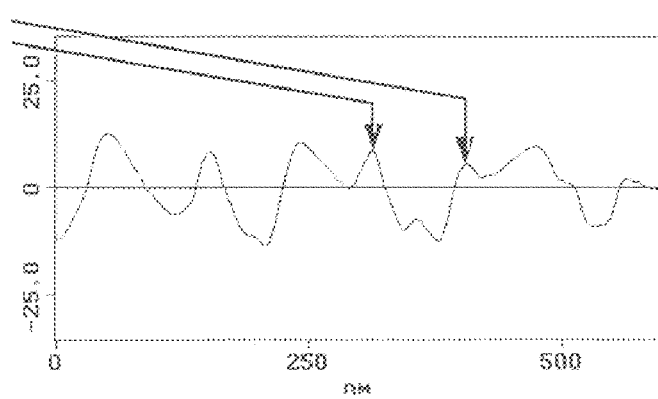

A left figure in FIG. 11 is an AFM image similar to a right figure of FIG. 10 described above, a right figure in FIG. 11 shows a view illustrating a distribution of elevations sectioned at a straight line portion drawn in the left figure. From this figure it will be clearly understood that bright portions correspond to the projection parts, and dark portions corresponding to the recess parts. That a difference of elevations between the top-most point of the projection parts and the bottom-most point of recessed parts being of the maximum of 20 nm or so and being remarkably restrained will be understood by comparing it with 50 nm of poly-crystalline Si thin film illustrated in FIG. 7 described above.

Differences in coefficients of volume expansion or moduli of elasticity between Si and Ge are considered to be the main cause of the remarkable difference in the elevation. That is, a thin film is formed by a lattice constant (larger than amorphous Si) as mixed crystals of amorphous SiGe before annealing, however, since a soft Ge-rich phase is formed around a comparatively hard Si crystal by a phase separation at the time of solidification, the grain boundary causes a relaxation of volume expansion portion, as a result, it is considered that the surface roughness can be restrained. Anyway, a poly-crystalline SiGe thin film of the present invention is understood that it has only unusually smaller surface roughness than a conventional poly-crystalline Si thin film.

Figure 12:
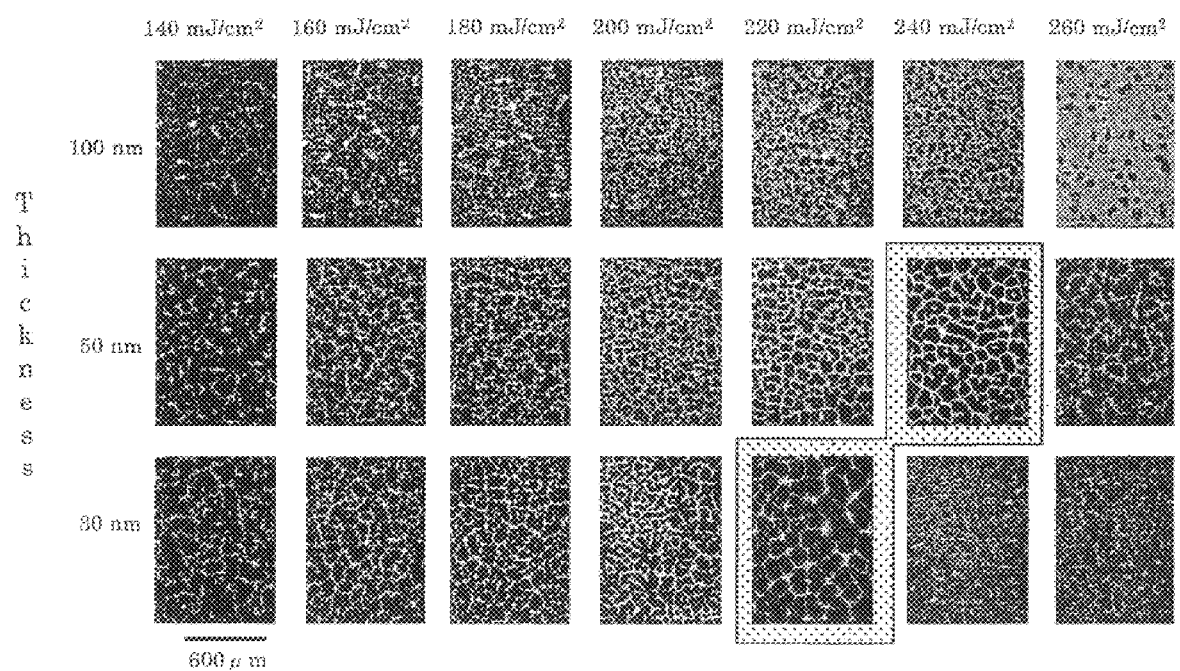
FIG. 12 shows views illustrating laser annealing conditions required for forming a poly-crystalline $Si_{1-x}Ge_x$ thin film of the present invention in a case of a ratio x of Ge composition, x=0.3.

FIG. 12 shows views illustrating laser annealing conditions required for forming a poly-crystalline SiGe thin film of the present invention in a case of a ratio x of Ge composition, x=0.3. An abscissa shows a energy density [mJ/cm$^2$] of excimer (Krf) laser, an ordinate shows a film thickness of a poly-crystalline SiGe thin film, and frequencies of all laser beam annealing of 30 times. When the energy density is gradually increased from the minimum 140 [mJ/cm$^2$], bright contrast regions showing surface projection parts are gradually increased.

Among them only in the case of film thickness 50 nm and 30 nm, it will be understood that respectively at 240 [mJ/cm$^2$], and 220 [mJ/cm$^2$] of the energy density, projection parts are peculiarly coincided with the structure of the crystal grain boundaries. Structures like this can be observed in the other ratio of Ge compositions (for example x=0.1 or the like), in any case, it has been clear that only under very narrow annealing condition, the coincidence can be realized. The cause is considered being resulted from the reason that a condition under which Ge concentration introduced before annealing becoming timely in a segregable condition in the solidification process is not so much wide, however, in the present invention, a poly-crystalline SiGe thin film which has been realized under condition of these peculiar annealing treatment is effectively utilized.

With this much, the explanation about the characteristics of a crystal growth of a poly-crystalline SiGe thin film which are features of the present invention will be closed. Hereinafter, embodiments of the present invention will be explained.

Hereinafter, the embodiments of the present invention will be specifically explained with reference to FIG. 1 to FIG. 5.

First Embodiment

Figure 1:
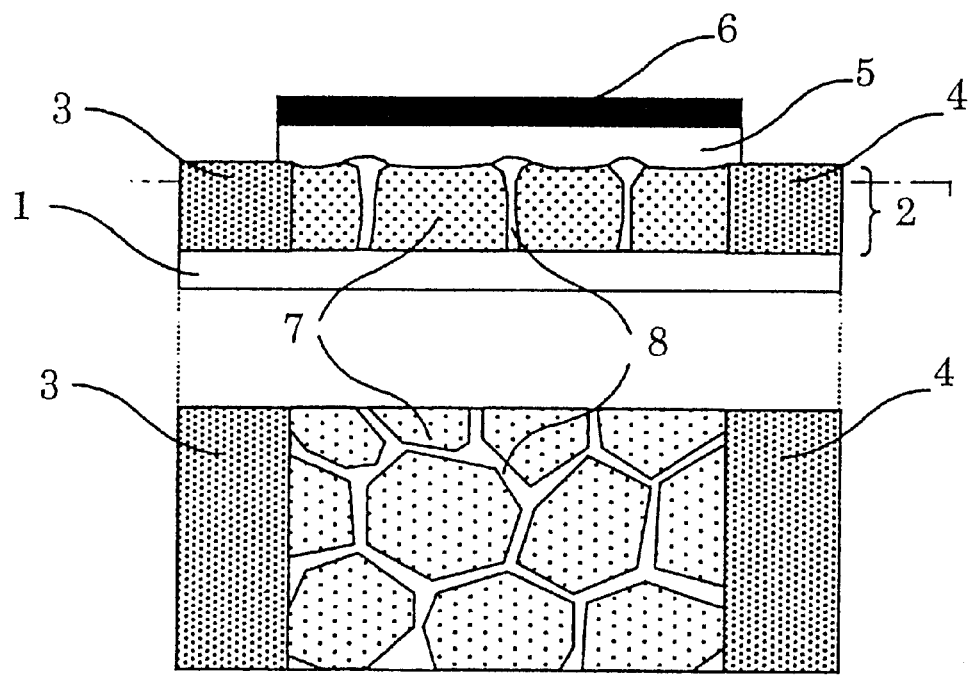
FIG. 1 shows development illustrating a thin film transistor device relating to a first embodiment of the present invention. In the drawing, a figure in an upper stage in FIG. 1 shows a longitudinal sectional view, a figure in an lower stage thereof shows a plan view transversely cross sectioning a channel portion.

FIG. 1 shows development illustrating a thin film transistor device relating to a first embodiment of the present invention. In the drawing, a figure in an upper stage in FIG. 1 shows a longitudinal sectional view, a figure in an lower stage thereof shows a plan view transversely (taken on line X–X') cross sectioning a channel portion. A poly-crystalline $Si_{1-x}Ge_x$ thin film is formed on the insulator substrate 1 composed of a glass plate under a condition of forming film by plasma CVD described later, and under a laser annealing condition.

That is, as raw material gas, silane and germane being utilized, while a gas volume is adjusted for obtaining a flow ratio between Si versus Ge of 0.7 versus 0.3, an amorphous $Si_{1-x}Ge_x$ thin film is formed by the plasma CVD trying and obtaining the total film thickness of 50 nm.

Next, a poly-crystalline $Si_{1-x}Ge_x$ thin film 2 is formed by irradiating an excimer laser with respect to a surface of the substrate 1 on which a film being formed under condition of the laser annealing that an energy density of 240 [mJ/cm$^2$], the number of pulsed laser beam of 30 shots, a pulse frequency of 100 Hz.

A source 3 and a drain 4 are formed on this poly-crystalline $Si_{1-x}Ge_x$ thin film, and a gate insulation film 5 and a gate 6 are formed on a channel. Of the channel, in particular, a region directly below the gate insulation film 5 is an active region of an electric field effect transistor, so that a current density is the largest. A plan view of that portion is drawn in a lower stage of FIG. 1, in the present embodiment a ratio x of Ge composition in an interior of a crystal grain 7 of the poly-crystalline $Si_{1-x}Ge_x$ thin film on this plane is set 0<x≦0.1, a ratio x of a Ge composition in a grain boundary of crystal 8 is set, 0.3≦x<1.

With such a lattice structure, a difference in elevations between surfaces (projection parts) of grain boundaries 8 and surfaces (recessed parts) of crystal grains 7 is about 20 nm and the difference is remarkably restrained, so that a gate insulation film 5 can be made comparatively thin (~50 nm). Therefore, since a number of carriers can be induced to the channel by a relatively small gate voltage, high mobility can be realized.

Further, since most of the crystal grains 7 are trued up to a {110} surface in parallel to the substrate 1, a lattice conformity in crystal grain boundaries is relatively tidy, so that it has an effect that current scattering in grain boundary can be restrained. The present embodiment is further characterized in that it has an advantage such as improving mobility of entire films by forming a Ge-rich phase of high mobility in the grain boundaries 8.

In the meantime, measurement of a ratio x of Ge composition with respect to Si in a poly-crystalline $Si_{1-x}Ge_x$ thin film is conducted by following methods.

Concentrations of Si and Ge are measured by limiting small (about 100 nm) an electron beam for a probe of an X-ray micro-analyzer equipped with in an interior of a transmission electron microscope (TEM), irradiating surfaces of a sample, and by measuring a wave length and intensity of a characteristic X-ray emitted from a laser irradiation region.

Next, a ratio x of a Ge composition relative to Si is found by calculation using the results of measurement for the concentrations of Si and Ge.

Further, the measurement of a ratio of composition for a crystal grains is conducted so that a laser beam irradiation region is contained in an interior of a crystal grain. Measurement of a ratio of composition at a grain boundary is conducted so that a laser beam irradiation region includes a grain boundary. Here, the laser beam irradiation region may well be protruded from the grain boundary and may stride over the crystal grains.

Second Embodiment

Figure 2:
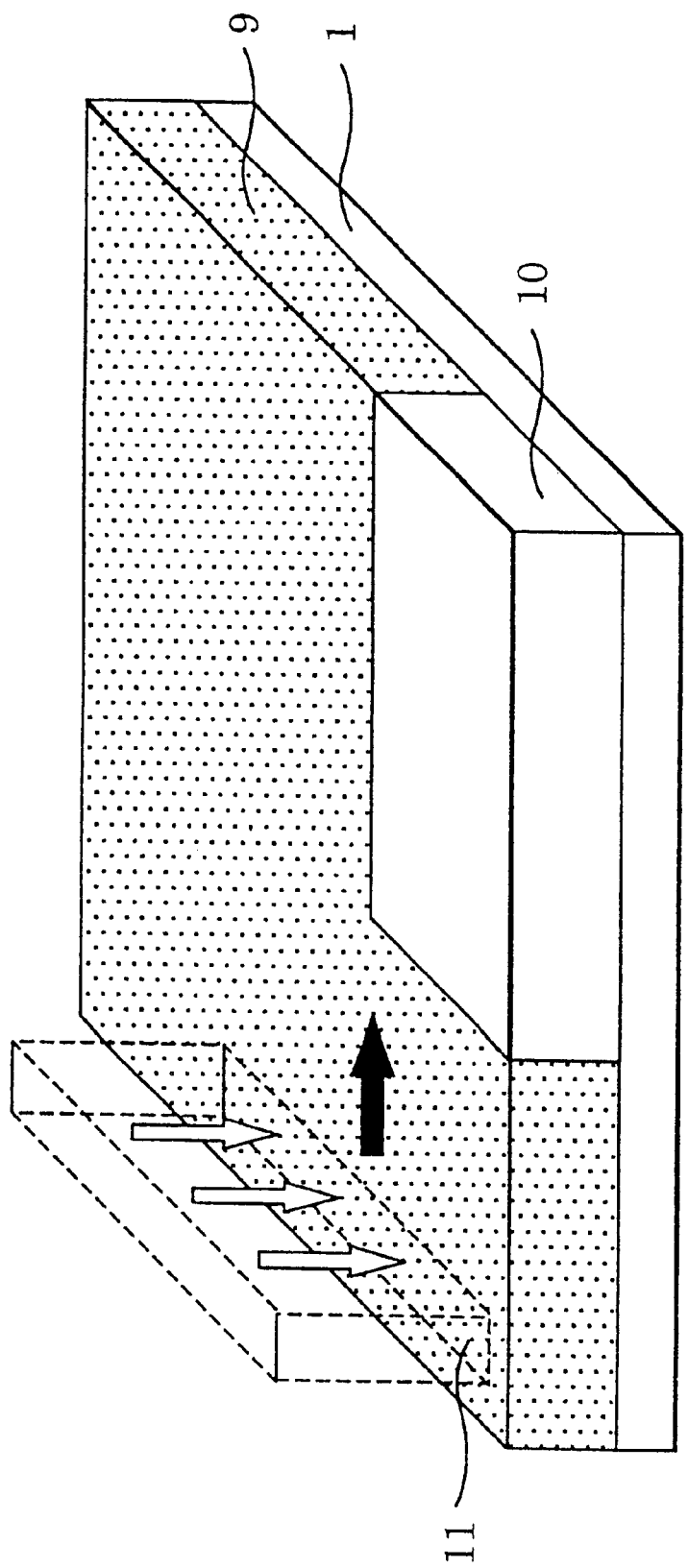
FIG. 2 shows a view typically illustrating a thin film transistor device and a process for producing thereof relating to a second embodiment of the present invention.
Figure 3:
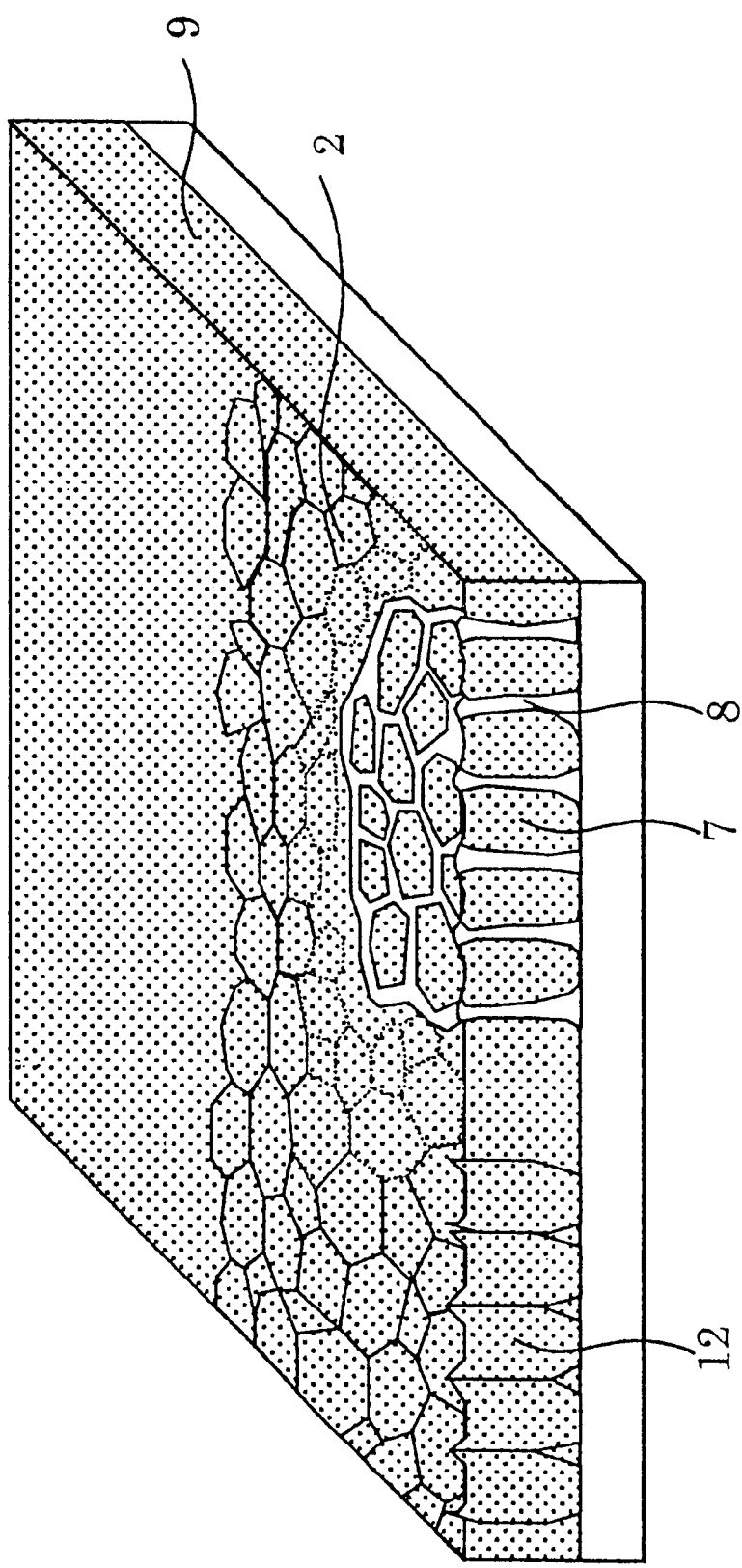
FIG. 3 similarly shows a view typically illustrating a thin film transistor device and a process for producing thereof relating to a second embodiment of the present invention.
Figure 4:
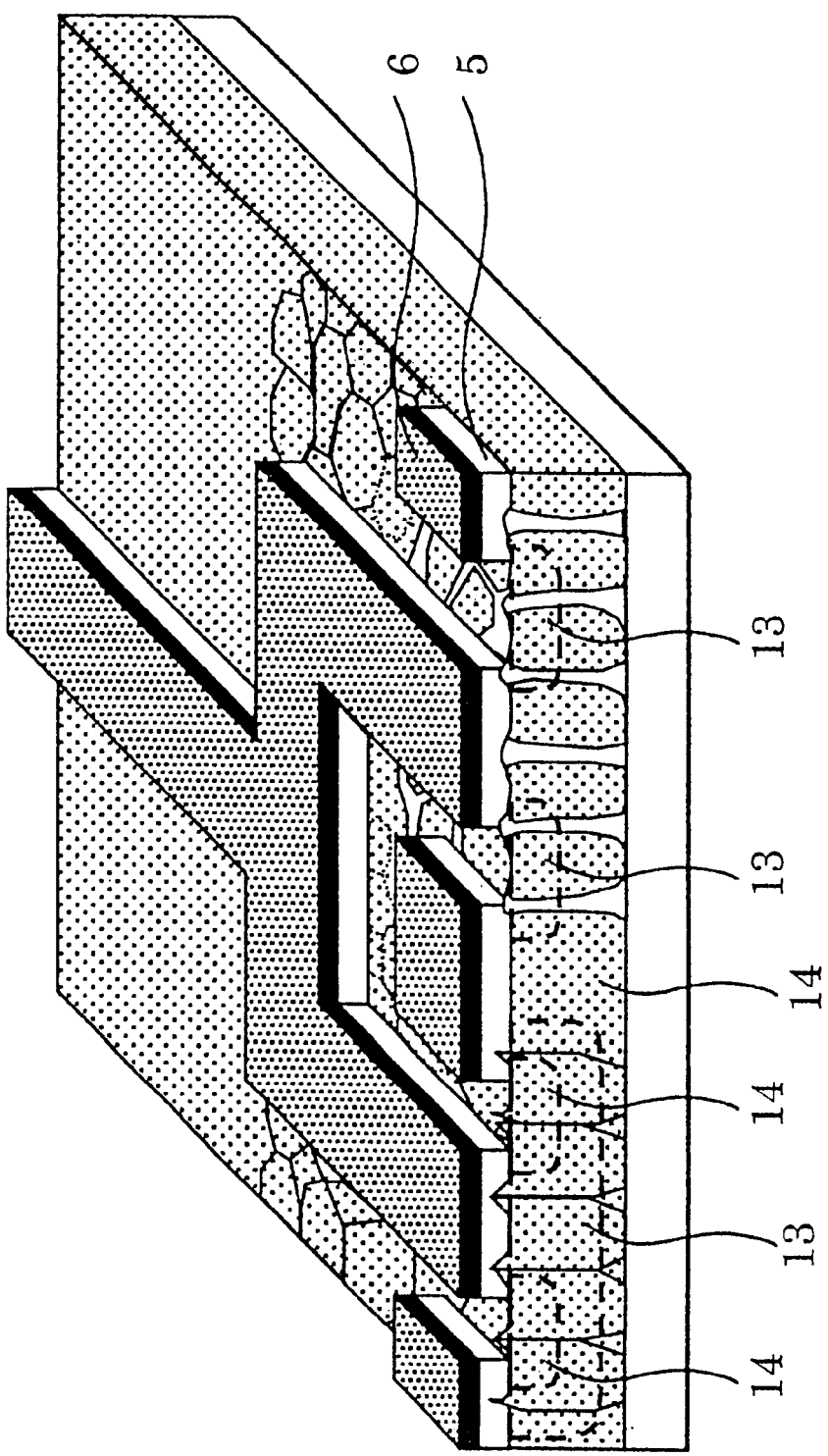
FIG. 4 similarly shows a view typically illustrating a thin film transistor device and a process for producing thereof relating to a second embodiment of the present invention.

FIG. 2–FIG. 4 show views typically illustrating a thin film semi-conductor device and production process thereof relating to second embodiment of the present invention. In the present embodiment, a poly-crystalline $Si_{1-x}Ge_x$ thin films are partially introduced and a transistor is CMOS, (complementary MOS)-formed.

Firstly, as illustrated in FIG. 2, an amorphous Si thin film 9 is formed on an insulator substrate (glass plate) 1. A part of it is conducted etching and removed with a photo process and is provided with an increased region 10 of a ratio of an embedded type Ge composition. A laser beam irradiation region 11 of thus obtained thin film surface is scanned by sequentially moving a stage retained the substrate 1 while conducting KrF excimer laser beam irradiation. At this time, by program controlling, in advance, a moving region of the stage, selectively crystallize only portions being later transistor regions.

With such a process, as illustrated in FIG. 3, pure Si poly-crystals 12 and poly-crystalline $Si_{1-x}Ge_x$ thin films 2 regions are formed only on a required region of the amorphous Si thin film 9.

Next, as illustrated in FIG. 4, n type regions 14 are formed by implanting As ions on an crystallized thin film, further, p type regions 13 are formed by implanting B ions, and both of them systematically and region selectively formed by utilizing respectively an implanting mask. Thereafter, furnace annealing is conducted in a nitrogen atmosphere at temperature of 600° C. for approximately one hour, and the carriers of n type regions 14 and in p type regions 13 are activated, on them gate insulation films 5 and gates 6 are provided to form transistors.

By so doing, there is an advantage that the CMOS type transistors in which low consumption power and high mobility being made compatible, are formed by respectively forming an n type transistor composed of the poly-crystalline Si thin films 12 in the p type region 13, further, a p type transistors composed of the poly-crystalline $Si_{1-x}Ge_x$ thin films 2 in the n type region 14.

Third Embodiment

Figure 5:
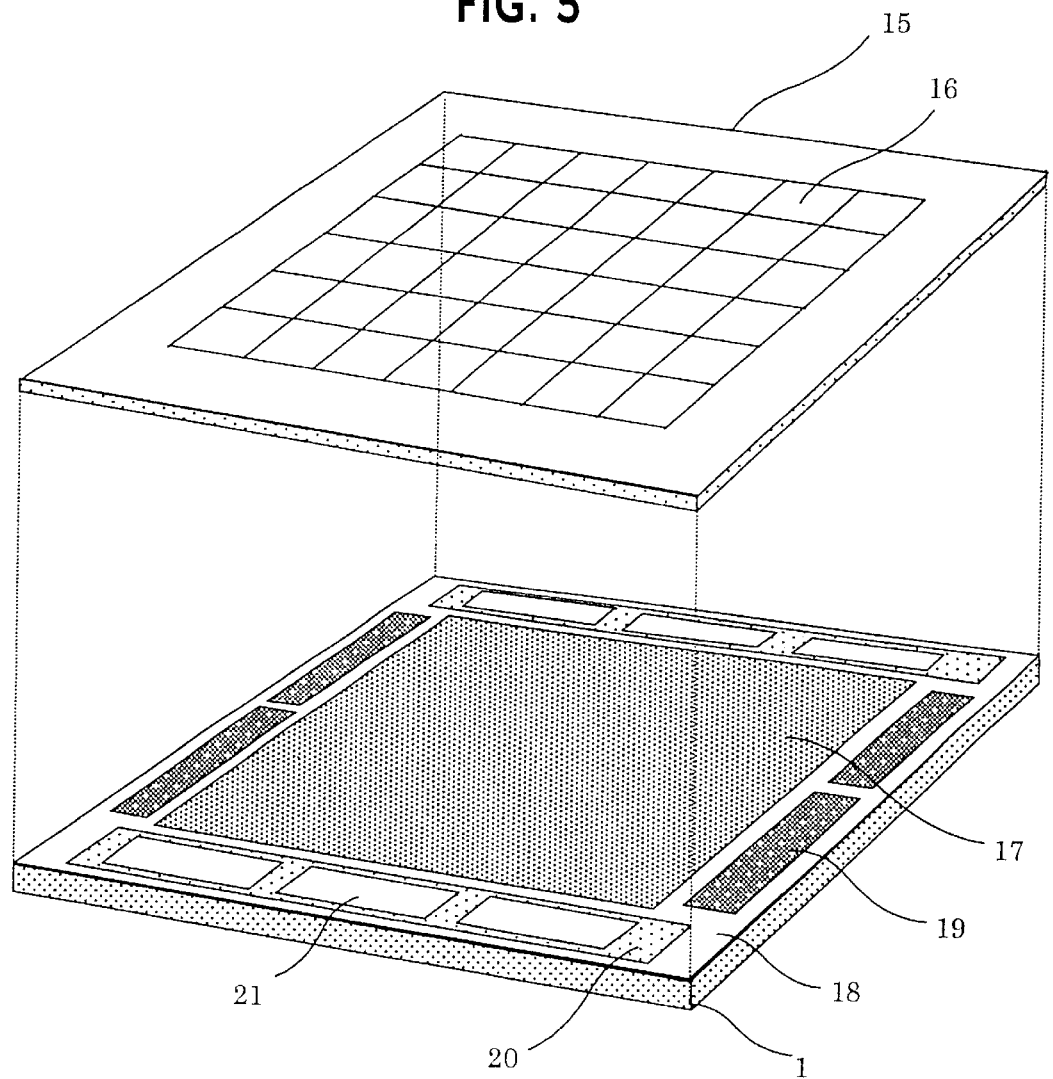
FIG. 5 shows a view illustrating an example of an image display device used thin film transistor devices of the present invention.

FIG. 5 shows an example of exploded and assembled view of an image display device used a thin film semiconductor device of the present invention. Polycrystalline Si thin films and poly-crystalline $Si_{1-x}Ge_x$ thin films are selectively formed on a insulator substrate (glass plate) 1, circuits composed of a pixel driver region 17, a buffer amplifier region 18, gate driver regions 19, shift resister regions 20, gate driver regions 21 and the like are integrated on the poly-crystalline Si thin films and the poly-crystalline $Si_{1-x}Ge_x$ thin films, these are integrally formed, and are connected to a an image display panel 15 having pixels 16, and are functioned.

Since required performances to transistors constituting these circuits are respectively different from each other, a first to third embodiments of the present invention are selectively and complexedly combined with one another and utilized. With such a constitution, the main circuit can be integrated on the glass substrate of large area, and an image display device integrated the most of conventional peripheral circuits can be formed. Further, there is an advantage that the image display device can be produced with few processes utilizing the low cost glass substrates.

What is claimed is:

1. A thin film transistor device comprising:
   (a) an insulator substrate;
   (b) a poly-crystalline thin film formed on said insulator substrate; and
   (c) a transistor including a source, a drain, a channel, and a gate formed on said poly-crystalline thin film,
   wherein said poly-crystalline thin film in a channel part of said transistor is comprised of a silicon-germanium poly-crystalline $Si_{1-x}Ge_x$ in which a Ge concentration x is 0<x<1, and a Ge concentration x in the poly-crystalline thin film is larger in a grain boundary than a portion where a Ge concentration in an interior crystal grain of the poly-crystalline thin film becomes a minimum value.

2. A thin film transistor device as set forth in claim 1, wherein a thickness of said poly-crystalline thin film is 10–100 nm, a ratio x of a Ge concentration in a portion where a Ge concentration is the minimum value in an interior grain of crystal forming said poly-crystalline thin film is $0<x\leq0.3$, a ratio x of a Ge concentration in a grain boundary is $0.1<x\leq1.0$, and a ratio x of the Ge concentration is larger in the grain boundary than in a central part of the interior crystal grain.

3. A thin film transistor device as set forth in claim 1, wherein said poly-crystalline $Si_{1-x}Ge_x$ has surface roughness thereof in the grain boundary being equal to or less than 30 nm.

4. A thin film transistor device as set forth in claim 1, wherein a main current carried in a channel part of said transistor is a positive hole.

5. A thin film transistor device comprising:
   (a) an insulator substrate;
   (b) a poly-crystalline $Si_{1-x}Ge_x$ thin film formed on said insulator substrate in which a Ge concentration x is 0<x<1; and
   (c) a circuit part formed by integrating a plurality of pieces of transistors including sources, drains, channels, and gates formed on said poly-crystalline $Si_{1-x}Ge_x$ thin film,
   wherein, said circuit part is comprised of CMOS type transistors including a mixture of p type transistors and n type transistors, and at least one of said p type transistors is comprised of the transistor as set forth in claim 1.

6. A thin film transistor device comprising:
   (a) an insulator substrate;
   (b) a poly-crystalline thin film formed on said insulator substrate; and
   (c) a transistor including a source, a drain, a channel, and a gate formed on said poly-crystalline thin film,
   wherein said poly-crystalline thin film in a channel part of said transistor has a {110}-oriented crystal surface, and wherein an average lattice constant in a grain boundary is larger than an average lattice constant in an interior crystal grain part of the poly-crystalline thin film.

* * * * *